US012777608B2

(12) United States Patent
Chehade et al.

(10) Patent No.: US 12,777,608 B2
(45) Date of Patent: Oct. 27, 2026

(54) MULTI-LEVEL MODULAR DATACENTER ELECTRIC INFRASTRUCTURE AND LAYOUT CONFIGURATION

(71) Applicant: OVH, Roubaix (FR)

(72) Inventors: Ali Chehade, Moncheaux (FR); Gregory Francis Louis Bauchart, Wattrelos (FR); Maxime Lachevre, Hem (FR)

(73) Assignee: OVH, Roubaix (FR)

( * ) Notice: Subject to any disclaimer, the term of this patent is extended or adjusted under 35 U.S.C. 154(b) by 127 days.

(21) Appl. No.: 18/813,336

(22) Filed: Aug. 23, 2024

(65) Prior Publication Data

US 2025/0081384 A1 Mar. 6, 2025

(30) Foreign Application Priority Data

Aug. 31, 2023 (EP) .................................... 23306456

(51) Int. Cl.
*H05K 7/14* (2006.01)
*H05K 7/20* (2006.01)

(52) U.S. Cl.
CPC ......... *H05K 7/1497* (2013.01); *H05K 7/1498* (2013.01); *H05K 7/20718* (2013.01); *H05K 7/20909* (2013.01)

(58) Field of Classification Search
CPC ...... H05K 7/14; H05K 7/1485; H05K 7/1491; H05K 7/1492; H05K 7/1497;
(Continued)

(56) References Cited

U.S. PATENT DOCUMENTS 3,923,096 A * 12/1975 van der Lely .......... F24F 3/044 454/295
6,155,747 A * 12/2000 Payne .................... B65D 90/18 588/259
(Continued)

FOREIGN PATENT DOCUMENTS

CN 102812192 A 12/2012
DE 102021109550 A1 10/2022
(Continued)

OTHER PUBLICATIONS

European Search Report to the counterpart EP Patent Application No. 23306456.7 completed on Feb. 26, 2024.

*Primary Examiner* — Jessica L Laux
(74) *Attorney, Agent, or Firm* — BCF LLP

(57) ABSTRACT

A multi-level modular datacenter for data processing equipment comprising a lower containment unit configured to house at least one uninterruptible power supply unit, a power distribution cabinet system, and one upper porthole disposed on a roof surface of the lower containment unit; an upper containment unit aligned and vertically disposed directly above the lower containment unit, the upper containment unit configured to house a battery assembly, a transformer, and a one lower porthole disposed on a floor surface of the upper containment unit; an electrical distribution infrastructure comprising electrically-communicative cabling to service the lower and upper containment units and the components disposed therein; and at least one electric conduit component, disposed between the lower and upper containment units configured to be aligned with the upper portholes and the lower portholes to accommodate routing of the electrically-communicative cabling and piping between the lower and upper containment units.

12 Claims, 7 Drawing Sheets

100

(58) Field of Classification Search
CPC .. H05K 7/1498; H02G 3/04; E04H 2005/005; E04H 5/02; E04H 5/04
See application file for complete search history.

(56) References Cited

U.S. PATENT DOCUMENTS

| | | | | |
|---|---|---|---|---|
| 11,624,182 | B2 * | 4/2023 | Williams | E04B 1/34869 52/39 |
| 2009/0229194 | A1 | 9/2009 | Armillas et al. | |
| 2011/0307102 | A1 * | 12/2011 | Czamara | H05K 7/1488 700/282 |
| 2021/0017763 | A1 * | 1/2021 | Mussati | E04B 9/06 |

FOREIGN PATENT DOCUMENTS

| | | | | |
|---|---|---|---|---|
| WO | 2011/127125 | A8 | 10/2011 | |
| WO | WO-2011127125 | A2 * | 10/2011 | H05K 7/20745 |
| WO | 2011159150 | A1 | 12/2011 | |

* cited by examiner

100

120

115

MULTI-LEVEL MODULAR DATACENTER ELECTRIC INFRASTRUCTURE AND LAYOUT CONFIGURATION

CROSS-REFERENCE TO RELATED APPLICATION

This application claims priority to European Patent Application No. 23306456.7, filed on Aug. 31, 2023, entitled "MULTI-LEVEL MODULAR DATACENTER ELECTRIC INFRASTRUCTURE AND LAYOUT CONFIGURATION," which is incorporated herein by reference in its entirety.

FIELD OF TECHNOLOGY

The present technology relates to overall datacenter configurations, and in particular, to an electric infrastructure and layout configuration for multi-level modular datacenter configurations.

BACKGROUND

In efforts to process vast amounts of data in near-real time, permanent datacenters house and service multitudes of racks containing electronic equipment, such as, computer server assemblies, specialized processors, memory components, high-speed network modules, etc. as well as supporting infrastructure equipment, such as, power facilities, air handling systems, liquid cooling structures, etc.

The market demand to service the ever-increasing data processing requirements eventually leads to the need of more datacenters. However, the initial investment costs along with the construction time associated with the installation of permanent datacenters can be prohibitive.

To counter the high cost of constructing permanent datacenters, various solutions have been proposed directed to the installation of "modular datacenters," in which datacenter electronic computing equipment and supporting infrastructure equipment are incorporated in movable trailers or shipping containers. Depending on data processing demands, multiple trailers/shipping containers may be deployed and arranged in different single level geometric configurations that spread across a sizeable area. Therefore, in contrast to permanent datacenters, modular datacenters provide substantial reductions in overall construction time and installation costs to provide speedier turn-key operations.

However, situations may exist in which certain space-limited geographical areas having high data processing needs (e.g., urban areas, research campuses, etc.), may not be able to accommodate sprawling modular datacenter configurations. It may, therefore, be desirable to provide multilevel modular datacenter configurations having smaller footprints. It may further be desirable to provide an electric infrastructure and configuration layout to optimize the limited space within these multilevel modular datacenters.

It is to be noted that the subject matter discussed in the background section should not be assumed to be prior art merely as a result of its mention in the background section. Similarly, the issues mentioned in the background section should not be interpreted as having been recognized in the prior art.

SUMMARY

Embodiments of the present technology have been developed based on certain drawbacks associated with conventional datacenter implementations.

In one aspect of the inventive concepts, the present technology provides a multi-level modular datacenter for data processing equipment that comprises a lower containment unit configured to house at least one uninterruptible power supply unit (UPS), at least one power distribution cabinet system (PDCS), and at least one upper porthole disposed on a roof surface of the lower containment unit; an upper containment unit arranged to be aligned and vertically disposed directly above the lower containment unit, the upper containment unit configured to house at least one battery assembly, at least one transformer, and at least one lower porthole disposed on a floor surface of the upper containment unit; an electrical distribution infrastructure comprising electrically-communicative cabling to service the lower and upper containment units, the electrical distribution infrastructure configured to enable electrical communications of components within each of the lower and upper containment units and enable electrical communications between components of the lower and upper containment units; and at least one electric conduit component, disposed between the lower containment unit and upper containment unit, configured to be aligned with the at least one upper porthole and the at least one lower porthole to accommodate routing of the electrically-communicative cabling and piping between the lower and upper containment units, wherein the positioning of the at least one battery assembly of the upper containment unit is proximately vertically-aligned with the positioning of the UPS of the lower containment unit and the positioning of the at least one transformer of the upper containment unit is proximately vertically-aligned with the positioning of the PDCS of the lower containment unit.

The multi-level modular datacenter also provides that the PDCS comprises at least one power distribution cabinet (PDC) that housing at least one power distribution cabinet unit (PDCU) in which the PDCU is configured to supply electrical power and be electrically- and communicatively-coupled to the UPS of the lower containment unit and to the battery assembly and transformer of the upper containment unit.

The multi-level modular datacenter further comprises a global monitoring system (GMS) configured to monitor the status of communicatively-coupled operational sensors of various components of the lower and upper containment units that implements a power monitoring subsystem (PMS) configured to monitor status of power and electrical consumption of associated components; a temperature/humidity monitoring subsystem (TMS) configured to monitor status of temperature and humidity levels of associated components, and a building equipment monitoring subsystem (BEMS) configured to monitor status of electrical circuit elements.

The multi-level modular datacenter wherein the at least one electric conduit component is further configured with a vertically-arranged skirt portion to facilitate slidable positioning between the at least one upper porthole and the at least one lower porthole; a horizontally-arranged attachment tab to facilitate secure fastening to the lower containment unit; and one or more of the following material elements: metal sleeves, firestop collars, intumescent strips, waterproof materials, and fire-resistant materials.

The multi-level modular datacenter additionally comprises an air-cooling partition wall disposed on the lower containment unit that operates to separate and isolate the air-cooling operations of the respective first and second sections containing the at least one UPS from the PDCS.

The multi-level modular datacenter also comprises an air-cooling partition wall to separate and isolate the air-cooling operations of the respective sections containing the at least one battery assembly from the at least one transformer.

The multi-level modular datacenter is further configured such that the electrical distribution infrastructure is configured to provide electrical communications by interconnecting the at least one UPS with the at least one PDCS of the lower containment unit and the at least one battery assembly with the at least one transformer of the upper containment unit as well as interconnecting the at least one UPS of the lower containment unit with the at least one battery assembly of the upper containment unit and the at least one PDCS of the lower containment unit with the at least one transformer of the upper containment unit.

In addition, the multi-level modular datacenter further comprises a moisture protection cap structure externally attached on an edge of the roof surface of the lower containment unit configured to divert any moisture from rain or snow away from the at least one electric conduit structure and a junction structure externally disposed on an edge of the floor surface of the upper containment unit, configured to facilitate engagement and provide a stable platform for adjoining an additional upper containment unit.

Implementations of the present technology each have at least one of the above-mentioned objects and/or aspects, but may not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

DETAILED DESCRIPTION

The instant disclosure is directed to addressing at least some of the issues associated with space-limited geographical areas having high data processing needs that may not be able to accommodate sprawling modular datacenter configurations. In particular, the instant disclosure presents various embodiments that provide an electric infrastructure and configuration layout to optimize the limited spaces within multilevel modular datacenters.

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative systems embodying the principles of the present technology.

With these fundamentals in place, we will now consider some non-limiting examples to illustrate the implementations of the various inventive aspects of the present disclosure.

Figure 1:
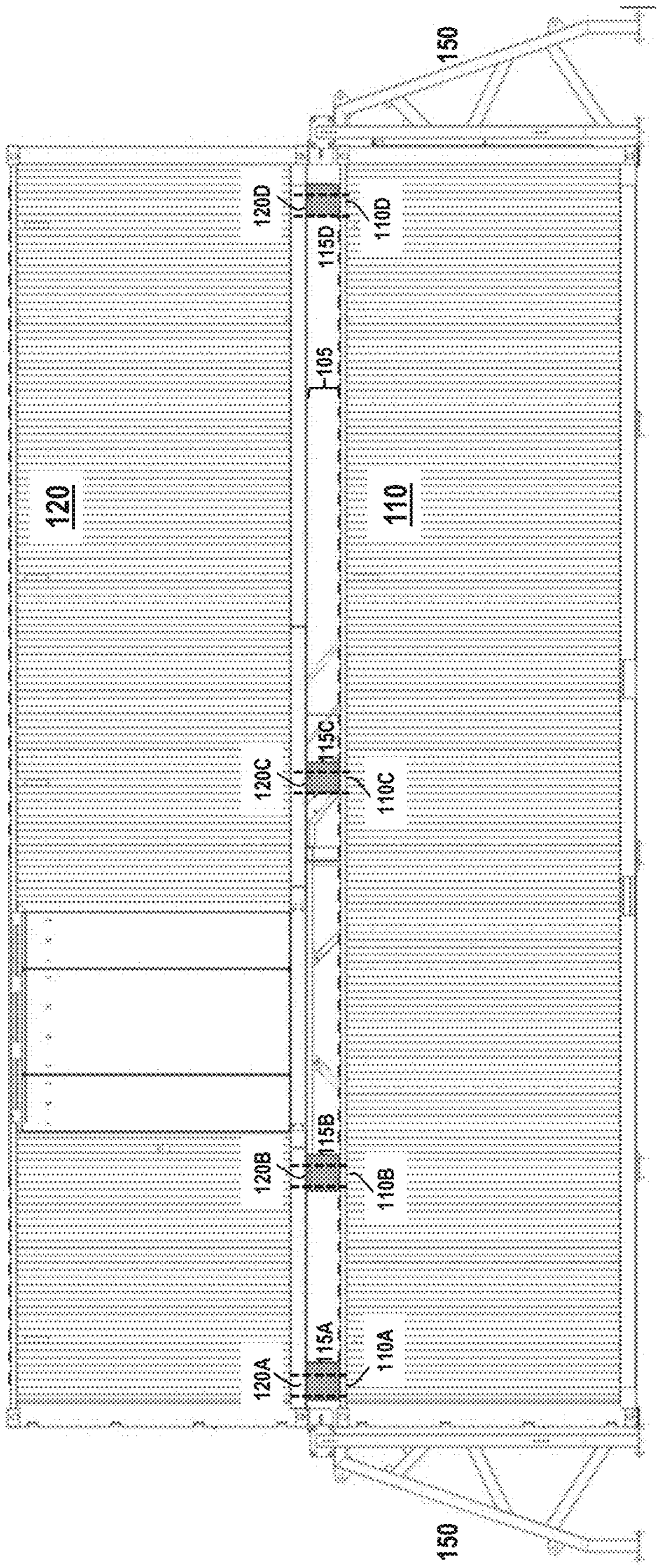
FIG. 1 depicts a side elevation view of a multilevel modular datacenter, in accordance with non-limiting embodiments of the present disclosure.

In particular, FIG. 1 depicts a side elevation view of a multilevel modular datacenter 100, in accordance with non-limiting embodiments of the present disclosure. As shown, the multilevel modular datacenter 100 employs a vertically-stacked arrangement comprising a lower containment unit 110 and an upper containment unit 120 that is vertically aligned and disposed directly above the lower containment unit 110.

The containment units 110, 120 may be embodied by trailers, shipping containers, or other similarly-configured structures. The vertically-stacked arrangement of containment units 110, 120 provides the benefit of a performing high volume data processing operations within a relatively limited footprint.

In the illustrated embodiment, the vertically-stacked multilevel modular datacenter configuration 100 employs support structures 150 proximately positioned along the underside of corner portions of upper containment unit 120. The vertically-stacked multilevel modular datacenter 100 may also employ support structures proximately positioned along the underside of lateral portions of upper containment unit 120. The support structures 150 function to raise, carry, and maintain the upper containment unit 120 above the lower containment unit 110 without imparting any weight bearing forces onto the lower containment unit 110. The raising of the upper containment unit 120 above the lower containment unit 110 by the support structures 150 produces an isolation gap 105 between the lower containment unit 110 and the upper containment unit 120.

However, it will be appreciated that in other implementations, the upper containment unit 120 may be supported by, and provide weight bearing forces onto, the lower containment unit 110. It will be appreciated that, for purposes of the instant disclosure, whether the upper containment unit 120 imparts weight bearing forces onto the lower containment unit 110 is not limiting with regard to the inventive concepts presented herein.

The vertically-stacked multilevel modular datacenter 100 are configured to house multitudes of racks containing electronic processing components (not shown), such as, computer server, specialized processors, memory components, high-speed network modules, etc. and electrical equipment. Accordingly, the lower and upper containment units 110, 120 require the installation of electrical equipment/facilities to support and service the power needs of the electronic processing racks. As will be described in greater detail below, the instant disclosure presents various embodiments that provide an electric infrastructure and configuration layout to optimize the electrically-communicative cabling connectivity within the limited spaces of the lower and upper containment units 110, 120 as well as between the lower and upper containment units 110, 120.

With this said, as shown in FIG. 1, the vertically-stacked multilevel modular datacenter 100 implements certain openings and conduit structures to accommodate the routing of electrically-communicative cabling and piping between the lower and upper containment units 110, 120. Specifically, the lower containment unit 110 incorporates at least one upper porthole 110A-D disposed on a roof surface of the lower containment unit 110 while the upper containment unit 120 incorporates at least one lower porthole 120A-D disposed on a floor surface of the upper containment unit 120. The at least one upper porthole 110A-D of the lower containment unit 110 and the at least one lower porthole 120A-D upper containment unit 120 are positioned and arranged to be vertically aligned with each other.

Figure 4:
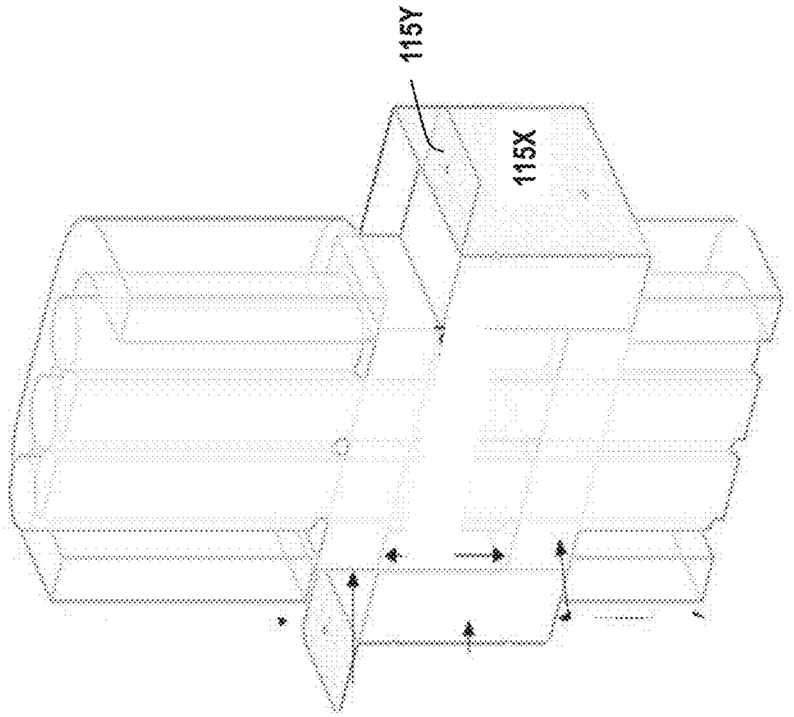
FIG. 4 depicts a perspective cross sectional view of an electric conduit structure, in accordance with non-limiting embodiments of the present disclosure.

Relatedly, the vertically-stacked multilevel modular datacenter 100 incorporates at least one electric conduit structure 115A-D, disposed between the lower containment unit 110 and upper containment unit 120 (i.e., mounted within the isolation gap 105), and configured to be positionally aligned with the at least one upper porthole 110A-D and the at least one lower porthole 120A-D. As best seen in FIG. 4, which depicts a perspective cross sectional view of the at least one electric conduit component 115A-D, in accordance with non-limiting embodiments of the present disclosure, the at least one electric conduit component 115A-D comprises an internal channelized structure for guiding the routing of the electrically-communicative cabling and an external structure embodying water- and fire-proof materials for the protection of the routed electrically-communicative cabling. In some implementations, the external structure of the at least one electric conduit component 115A-D may comprise one or more of the following elements: metal sleeves, firestop collars, intumescent strips, water-proof materials, and fire-resistant materials.

In some implementations, the at least one electric conduit component 115A-D may also comprise a vertically-arranged skirt portion 115X to facilitate the slidable positioning between the at least one upper porthole 110A-D and the at least one lower porthole 120A-D thereof as well as a horizontally-arranged attachment tab 115Y to facilitate the secure fastening thereof to the lower containment unit 110.

Figure 2:
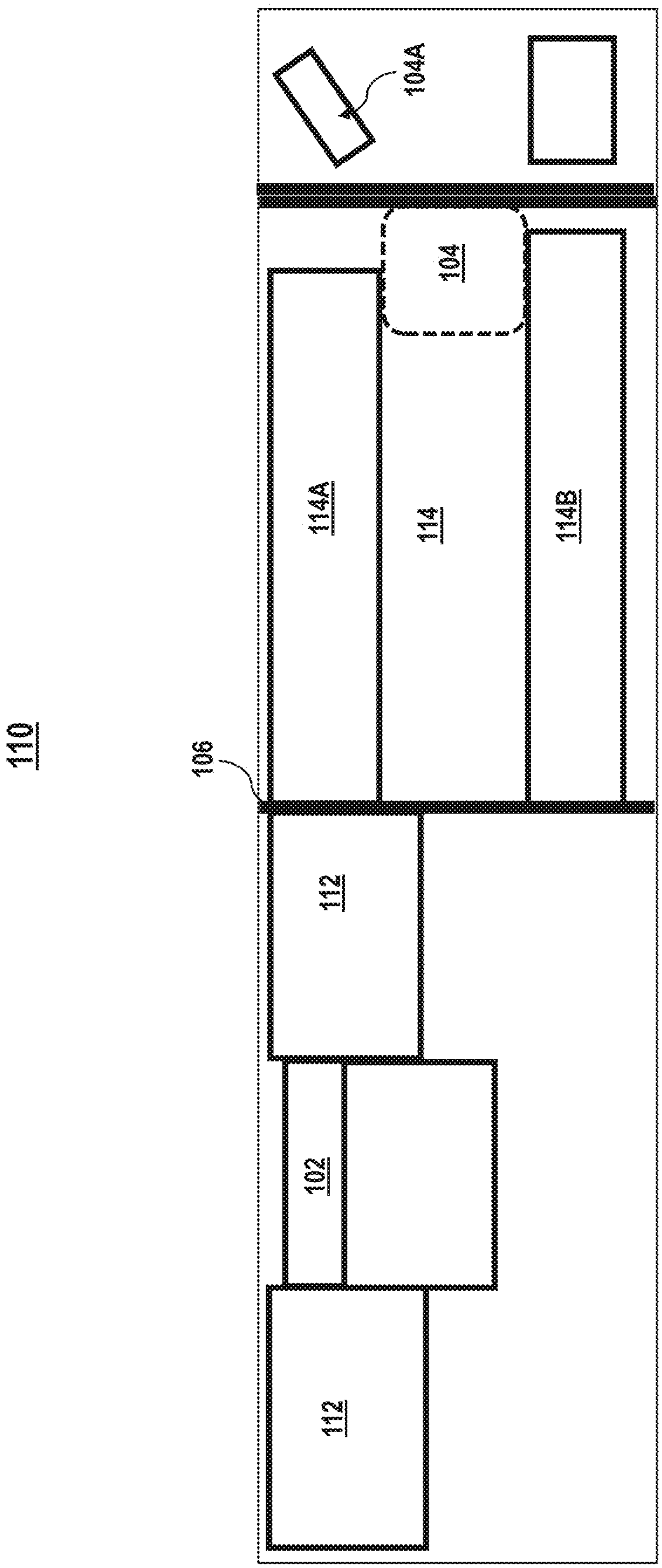
FIG. 2 depicts a top view of an internal layout configuration of a lower unit of a multilevel modular datacenter unit, in accordance with non-limiting embodiments of the present disclosure.

Moving to FIG. 2, depicting a top view of an internal layout configuration of the lower containment unit 110 of the multilevel modular datacenter 100, in accordance with non-limiting embodiments of the present disclosure. The lower containment unit 110 is configured to house at least one uninterruptible power supply unit (UPS) 112, a UPS air handler 102, at least one power distribution center system (PDCS) 114, and a PDCS air-cooling system 104. As shown, the UPS 112 and UPS air handler 102 are internally disposed in a first section on one side of the lower containment unit 110 while the PDCS 114 and PDCS air-cooling system 104 are internally disposed in a second section on an opposite side of the lower containment unit 110. The opposite first and second sections of the lower containment unit 110 are generally separated by an air-cooling partition wall 106.

The UPS 112 is configured to provide automated backup power in the event of main/utility power source outages or failures and, upon detecting an outage/failure, utilizes a battery assembly 122 of the upper containment unit 120 (described below) to supply continual back-up power.

The UPS air handler 102 is configured to provide air-cooling of the section containing the UPS 112. The UPS air handler 102 is designed to be installed typically in power rooms as well as IT rooms to assure sufficient heat treatment. The UPS air handler 102 is fluidly-connected to pumping module (not shown), which is linked to a dry cooler (not shown), and comprises finned heat exchangers (FHEXs) and fans (not shown). Hot air is collected by the fans due to a plenum installed over the UPS 112 and the air handler 102 to create a hot aisle. Hot air then passes through the FHEXs to be cooled by the cold water supplied by the dry coolers. Cold air exiting the air handler 102 is re-sucked by the heat source. The air handler 102 fans may be in the hot or in the cold aisles, in other words, before or after the FHEXs. In the depicted embodiment, two air handlers 102 are installed for reduced risk, in which is each air handler 102 can deliver for example 20 kW of cooling capacity. In this manner, if an air handler 102 is out of commission due to malfunction or maintenance, the second air handler 102 would be able to support the UPSs load in a degraded mode.

The PDCS 114 comprises at least one power distribution center (PDC) 114A and at least one power distribution center UPS (PDCU) 114B. The at least one PDC 114A distributes, monitors, controls, and optimizes power allocation to the numerous components of both the lower and upper containment units 110, 120. The at least one PDC 114A is fed from power sources comprising a power transformer, a generator, and back-up source which are mechanically and electrically interlocked between each other (closed transition). An internal PLC manages the sources as well as the PMS. Local switches also manage the PMS from the battery container, the power container, and the BMS. The PDC 114A conforms to the IEC 61439-2 Standard and feeds different non-UPS loads, and 1 or 2 UPS depending on the UPS rated power. The PDC 114A is configured to be strategically positioned to house and support PDCUs 114B, the positioning of which is arranged to minimize the required electrical cable lengths to the numerous components of both the lower and upper containment units 110, 120 of the multilevel modular datacenter 100.

The least one PDCU 114B is fed from the UPS 112 output and/or from the PDC 114A. The PDCU 114B is electrically- and communicatively-coupled to the UPS 112, PDC 114A, and cooling system of the lower containment unit 110. It is mainly dedicated to feed IT loads through MCCB (Molded Case Circuit breakers) with electronic trip units. The PDC 114B conforms to the IEC 61439-2 Standard.

The PDCS air-cooling system 104 comprises an air conditioning condenser 104A to remove heated air from the section containing the at least one PDC 114A and the at least one PDCU 114B and provide cooling air therethrough.

As such, the air-cooling partition wall 106 of the lower containment unit 110 operates to separate and isolate the air-cooling operations of the respective first and second sections containing the at least one UPS 112 from the PDCS 114.

Figure 3:
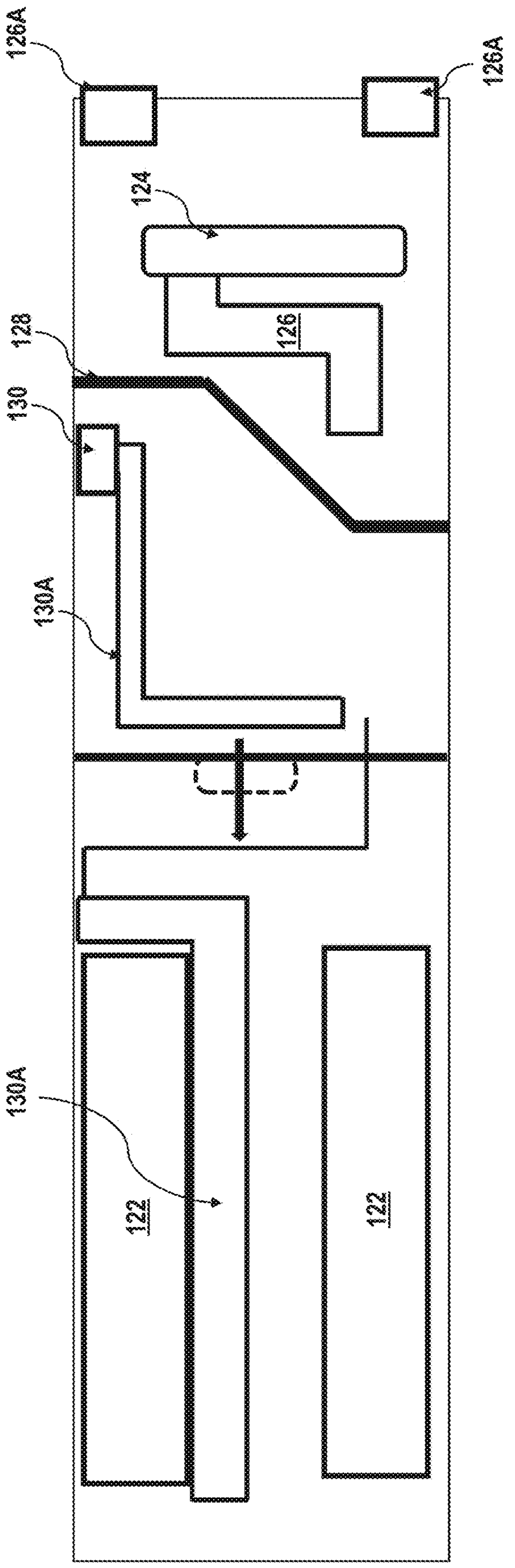
FIG. 3 depicts a top view of an internal layout configuration of an upper unit of a multilevel modular datacenter unit, in accordance with non-limiting embodiments of the present disclosure.

FIG. 3 depicts a top view of an internal layout configuration of the upper containment unit 120 of the multilevel modular datacenter 100, in accordance with non-limiting embodiments of the present disclosure. As shown, the upper containment unit 120 is configured to house at least one least one battery assembly 122, a battery assembly air-cooling system 130, at least one transformer 124, and a transformer air-cooling system 126.

The at least one battery assembly 122 and the battery assembly air-cooling system 130 are internally disposed in a first section on one side of the upper containment unit 120. The positioning of the at least one battery assembly 122 is proximately vertically-aligned with the positioning of the UPS 112 of the lower containment unit 110.

The at least one transformer 124 and the transformer air-cooling system 126 are internally disposed in a second section on an opposite side of the upper containment unit 120 that is generally separated from the by an air-cooling partition wall 128. The positioning of the at least one transformer 124 is proximately vertically-aligned with the positioning of the PDCS 114 of the lower containment unit 110.

The at least one transformer 124 is configured to convert the voltage levels supplied by the main/utility power source to voltage levels acceptable to service the power needs required by the electronic processing racks.

The transformer air-cooling system 126 comprises at least one air ventilation fan unit 126 that serves to remove heated air from that section of the upper containment unit 120 onto the external ambient environment and provide cooling air therethrough.

The at least one battery assembly 122 is communicatively coupled to the UPS 112 of the lower containment unit 110 and is configured to store sufficient electric charge levels to supply the necessary power to the electronic processing racks in the event of main/utility power source outages or failures.

The battery assembly air-cooling system 130 comprises an air conditioning unit configured to supply cooled air via a ventilation duct configuration 130A. The air-cooling partition wall 128 of the upper containment unit 120 operates to separate and isolate the air-cooling operations of the respective sections containing the at least one battery assembly 122 from the at least one transformer 124. In addition, the partition wall 128 provides protection to operators inside the aisle in case of fire due transformer malfunction 124.

As detailed above, the disclosed embodiments provide that the positioning of the at least one battery assembly 122 of the upper containment unit 120 is proximately vertically-aligned with the positioning of the UPS 112 of the lower containment unit 110. The disclosed embodiments further provide that the positioning of the at least one transformer 124 of the upper containment unit 120 is proximately vertically-aligned with the positioning of the PDCS 114 of the lower containment unit 110.

It should be appreciated that the disclosed layout positioning of the battery assembly 122 to be proximately vertically-aligned with the UPS 112 and the transformer 124 to be proximately vertically-aligned with the PDC 114A, provides a multilevel modular datacenter 100 configuration that substantially minimizes the required electrical cable lengths as well as reducing installation complexity and associated costs.

Figure 5:
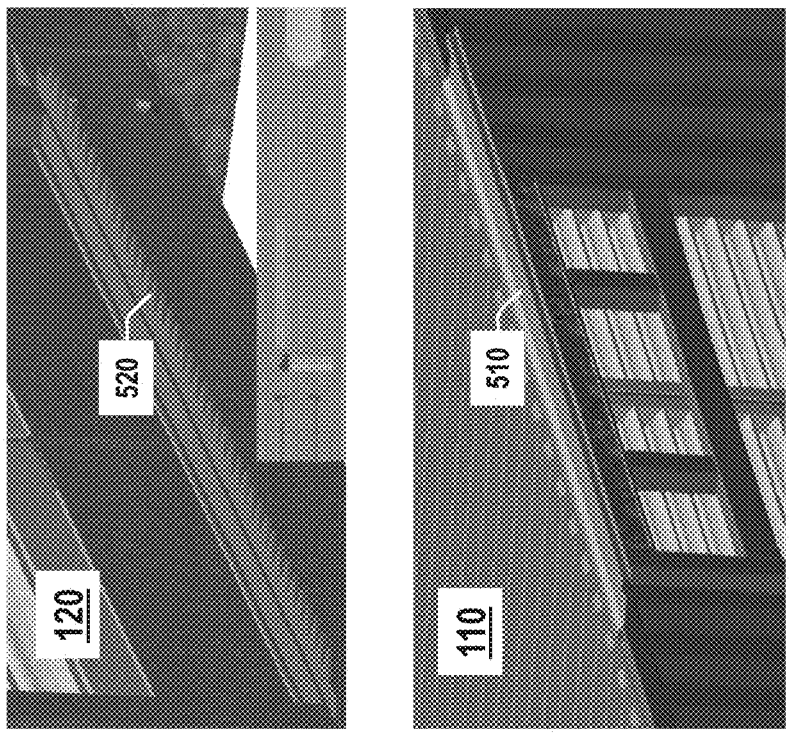
FIG. 5 depicts a protection cap structure and a junction structure, in accordance with non-limiting embodiments of the present disclosure.

FIG. 5 depicts a moisture protection cap structure 510 and a junction structure 520 for the multilevel modular datacenter 100, in accordance with non-limiting embodiments of the present disclosure. In particular, the moisture protection cap structure 510 is externally attached to an edge of the roof surface of the lower containment unit 110. The moisture protection cap structure 510 is configured and operates to divert any moisture from rain or snow away from the at least one electric conduit structure 115A-D. The moisture protection cap structure 510 may comprise any suitable material, such as, metal, plastic, etc. that can be formed with a surface that directs moisture away from the position of the at least one electric conduit structure 115A-D.

The junction structure 520 is externally attached to on an edge of the floor surface of the upper containment unit 110. The junction structure 520 is configured and operates to facilitate engagement and provide a stable platform for adjoining an additional lower containment unit 110. In the depicted embodiment, the junction structure 520 comprises a toothed outer edge profile but other suitable outer edge profiles, such as, dovetail, scallop, etc. are contemplated.

Figure 6:
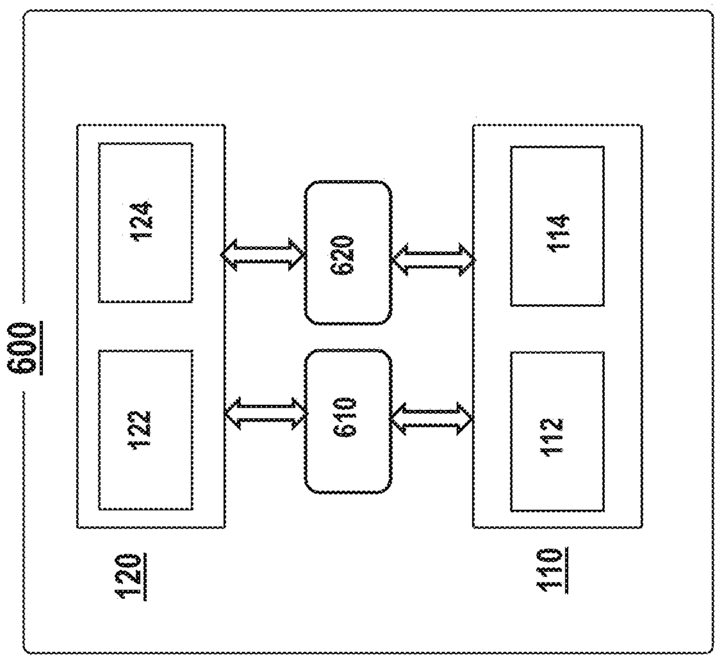
FIG. 6 depicts a functional block diagram of a global monitoring system for a multilevel modular datacenter, in accordance with non-limiting embodiments of the present disclosure.

FIG. 6 depicts a functional block diagram of a global monitoring system (GMS) 600 for the multilevel modular datacenter 100, in accordance with non-limiting embodiments of the present disclosure. The GMS 600 is configured and operates to monitor the status of communicatively-coupled operational sensors of various components of the lower and upper containment units 110, 120, detect any failures or anomalies, and notify operators of any potential issues. As shown, GMS 600 comprises a power monitoring subsystem (PMS) 610, a temperature/humidity monitoring subsystem (TMS) 620 and a building equipment monitoring subsystem (BEMS) 630.

The PMS 610 comprises communicatively-coupled current, voltage, and/or power sensors (not shown) coupled to the UPS 112, PDC 114A, PDCU 114B, and cooling system of the lower containment unit 110 as well as coupled to the battery assembly 122 and transformer 124 of the upper containment unit 120. The PMS 610 monitors the power and electrical consumption status of these components and can detect any failures or anomalies and report any potential electrical or power issues to operators.

The BMS 620 comprises communicatively-coupled temperature and humidity sensors (not shown) coupled to the PDC 114A, and cooling system of the lower containment unit 110 as well as coupled to the battery assembly 122 and transformer 124 of the upper containment unit 120. The BMS 620 monitors the temperature and humidity levels experienced by these components and reports any potential heat or humidity issues to operators.

Figure 7:
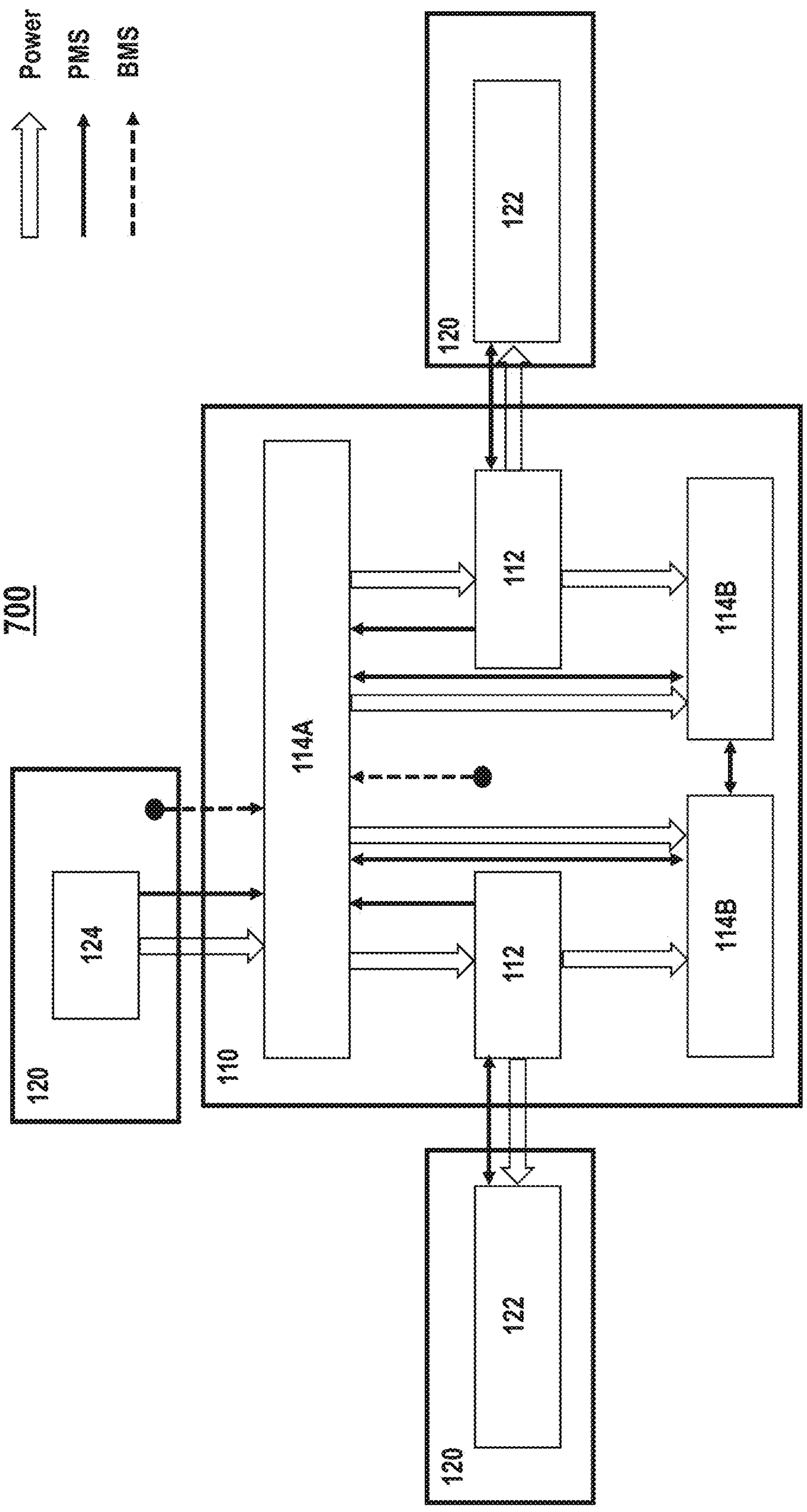
FIG. 7 depicts a functional block diagram of an electrical distribution infrastructure for a multilevel modular datacenter, in accordance with non-limiting embodiments of the present disclosure.

FIG. 7 depicts a functional block diagram of an electrical distribution infrastructure 700 for the multilevel modular datacenter 100, in accordance with non-limiting embodiments of the present disclosure. As shown, electrical distribution infrastructure 700 is communicatively-coupled to the UPS 112 and PDCS 114 of the lower containment unit 110 as well as the communicatively-coupled battery assembly 122 and transformer 124 of the upper containment unit 120.

The electrical distribution infrastructure 700 is configured to provide the electrical power to the UPS 112 and PDC 114A, PDCU 114B of the lower containment unit 110 as well as the battery assembly 122 and transformer 124 of the upper containment unit 120. The electrical distribution infrastructure 700 comprises the cabling facilities and layout positioning of the battery assembly 122 to be proximately vertically-aligned with the UPS 112 and the transformer 124 to be proximately vertically-aligned with the PDC 114A. The electrical distribution infrastructure 700 also comprises cabling facilities to support and provide communications to the electrical circuit elements, such as, fuses, switches, etc. associated with the BMS 620.

In this manner, the disclosed embodiments provide a multilevel modular datacenter 100 configuration having an electric infrastructure and component configuration layout to optimize the limited spaces within multilevel modular datacenters that substantially minimizes required electrical cable lengths and reduces installation complexity and associated costs.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A multi-level modular datacenter for data processing equipment, comprising:

a lower containment unit housing at least one uninterruptible power supply unit (UPS), at least one power distribution center system (PDCS), and at least one upper porthole disposed on a roof surface of the lower containment unit;

an upper containment unit arranged to be aligned and vertically disposed directly above the lower containment unit, the upper containment unit housing at least one battery assembly, at least one transformer, and at least one lower porthole disposed on a floor surface of the upper containment unit;

an electrical distribution infrastructure comprising electrically-communicative cabling to service the lower and upper containment units, the electrical distribution infrastructure configured to enable electrical communications of components within each of the lower and upper containment units and enable electrical communications between components of the lower and upper containment units; and at least one electric conduit component, disposed between the lower containment unit and upper containment unit, configured to be aligned with the at least one upper porthole and the at least one lower porthole to accommodate routing of the electrically-communicative cabling between the lower and upper containment units, the at least one electric conduit component comprising:

a vertically-arranged skirt portion to facilitate slidable positioning between the at least one upper porthole and the at least one lower porthole;

a horizontally-arranged attachment tab to facilitate secure fastening to the lower containment unit; and one or more of the following material elements: metal sleeves, firestop collars, intumescent strips, waterproof materials, and fire-resistant materials, wherein the positioning of the at least one battery assembly of the upper containment unit is arranged to be directly above the positioning of the UPS of the lower containment unit and the positioning of the at least one transformer of the upper containment unit is arranged to be directly above the positioning of the PDCS of the lower containment unit.

2. The multi-level modular datacenter of claim 1, wherein the PDCS comprises at least one power distribution center (PDC) and at least one power distribution center UPS (PDCU).

3. The multi-level modular datacenter of claim 2, wherein the PDCU is configured to supply electrical power and be electrically-and communicatively-coupled to the UPS of the lower containment unit and to the at least one battery assembly and at least one transformer of the upper containment unit.

4. The multi-level modular datacenter of claim 1, further incorporating a global monitoring system (GMS) configured to monitor the status of communicatively-coupled operational sensors of various components of the lower and upper containment units, the GMS comprising:

a power monitoring subsystem (PMS) configured to monitor status of power and electrical consumption of associated components; and a temperature/humidity monitoring subsystem (TMS) configured to monitor status of temperature and humidity levels of associated components.

5. The multi-level modular datacenter of claim 4, wherein the GMS is further configured to provide notifications of any detected failures, malfunctions, and/or any potential issues based on the monitored status of the PMS and TMS.

6. The multi-level modular datacenter of claim 1, wherein the lower containment unit comprises an air-cooling partition wall that operates to separate and isolate the air-cooling operations of respective first and second sections containing the at least one UPS from the PDCS.

7. The multi-level modular datacenter of claim 1, wherein the upper containment unit comprises an air-cooling partition wall to separate and isolate air-cooling operations of respective sections containing the at least one battery assembly from the at least one transformer.

8. The multi-level modular datacenter of claim 1, wherein the at least one electric conduit component comprises an internal channelized structure for guiding the routing of the electrically-communicative cabling and an external structure embodying water-and fire-proof material for protection of the routed electrically-communicative cabling.

9. The multi-level modular datacenter of claim 1, wherein the electrical distribution infrastructure is configured to provide electrical communications by interconnecting:

the at least one UPS with the at least one PDCS of the lower containment unit; and the at least one battery assembly with the at least one transformer of the upper containment unit.

10. The multi-level modular datacenter of claim 1, wherein the electrical distribution infrastructure is further configured to provide electrical communications by interconnecting:

the at least one UPS of the lower containment unit with the at least one battery assembly of the upper containment unit; and the at least one PDCS of the lower containment unit with the at least one transformer of the upper containment unit.

11. The multi-level modular datacenter of claim 1, wherein the lower containment unit further comprises a moisture protection cap structure, externally attached on an edge of the roof surface of the lower containment unit, configured to divert any moisture from rain or snow away from the at least one electric conduit component.

12. The multi-level modular datacenter of claim 1, wherein the upper containment unit further comprises a junction structure, externally disposed on an edge of the floor surface of the upper containment unit, configured to facilitate engagement and provide a stable platform for adjoining an additional upper containment unit.

* * * * *